United States Patent [19]
Bang

[11] Patent Number: 5,466,620
[45] Date of Patent: Nov. 14, 1995

[54] METHOD FOR FABRICATING A LIQUID CRYSTAL DISPLAY DEVICE

[75] Inventor: Young U. Bang, Kyungki-do, Rep. of Korea

[73] Assignee: Goldstar Co., Ltd., Rep. of Korea

[21] Appl. No.: 356,000

[22] Filed: Dec. 14, 1994

[30]     Foreign Application Priority Data

Dec. 14, 1993 [KR] Rep. of Korea ............... 27653/1993

[51] Int. Cl.$^6$ ............................................. H01L 21/786
[52] U.S. Cl. ............................ 437/51; 437/181; 437/246
[58] Field of Search ........................ 437/51, 181, 40, 437/246, 101; 148/DIG. 150

[56]     References Cited

U.S. PATENT DOCUMENTS

| | | | |
|---|---|---|---|
| 4,738,749 | 4/1988 | Maurice et al. | 437/181 |
| 5,053,347 | 10/1991 | Wu | 437/40 |
| 5,198,377 | 3/1993 | Kato et al. | 437/40 |
| 5,340,773 | 8/1994 | Yamamoto et al. | 437/246 |
| 5,384,266 | 1/1995 | Chapman | 437/51 |

Primary Examiner—Brian E. Hearn
Assistant Examiner—Michael Trinh
Attorney, Agent, or Firm—Faegre & Benson

[57]     ABSTRACT

A method for fabricating a TFT-LCD which enables point defects such as electrical short circuits between a pixel and a thin film transistor or between a bus line and a pixel to be repaired during fabrication.

4 Claims, 8 Drawing Sheets

METHOD FOR FABRICATING A LIQUID CRYSTAL DISPLAY DEVICE

BACKGROUND OF THE INVENTION

1. Field of the Invention

The present invention relates to the fabrication of a liquid crystal display device with a plurality of thin film transistors (hereinafter, referred to as a "TFT-LCD device"). In particular, the present invention is a method for fabricating a TFT-LCD capable of repairing a point defect such as an electrical short between a pixel and a thin film transistor (hereinafter, referred to as "TFT"), or between a bus line and a pixel, while fabricating the device.

2. Description of the Related Art

Generally, a defect in a TFT-LCD can be broadly classified into two types, one of which is a point defect due to an inferior TFT, pixel electrode, pixel or the like. The other is a line defect due to an electrical open or short circuit of a bus line, or no interconnection to a driving IC (integrated circuit). Defects that occur frequently in a TFT-LCD include an electrical short at a crossover between the gate and data bus lines, an electrical short between the gate and source electrodes of a TFT, and an electrical open circuit of each of gate and data bus lines.

As TFT-LCD devices become large in scale and highly integrated, it is necessary to solve the above described defects during fabrication of the TFT-LCDs. Thus, TFT-LCDs with redundancy or repair structures have been proposed.

FIG. 1 is a plan view of a prior art TFT-LCD with a repair structure. FIG. 2A is a cross-sectional view taken along the line A–A' in FIG. 1. FIG. 2B is a cross-sectional view taken along the line B–B' in FIG. 1.

Referring to FIG. 1, a prior art TFT-LCD comprises a plurality of pixel electrodes 40 and TFTs 10 arranged in a matrix of rows and columns, and a plurality of gate and data bus lines 20 and 30, respectively. In this TFT-LCD, the pixel electrode 40 and the TFT 10 are alternately arranged with respect to each other. The gate bus line 20 is extended between the pixel electrodes and is commonly connected to gates of the TFTs 10 arranged in the same row. The data bus line 30 is formed in a zigzag pattern between the pixel electrodes, and is commonly connected to source electrodes of the TFTs 10 arranged in the same column.

With reference to FIGS. 2A and 2B, each of the TFTs 10 has a gate electrode 11 formed on a glass substrate 100, a gate insulating layer 12 formed over the substrate, and a semiconductor layer 13 formed above the gate electrode 11 with the gate insulating layer 12 interposed therebetween. The semiconductor layer 13 can be composed of amorphous silicon. A channel protecting layer 14 is formed on the semiconductor layer 13. An n$^+$ type amorphous silicon ohmic layer 15 is formed over the semiconductor layer 13 and the sides of the channel protecting layer 14 (but not the center surface of the channel protecting layer 14). A redundancy ITO (indium tin oxide) pattern 16 is formed on the gate insulating layer 12, including over one side of the ohmic layer 15. A drain electrode 18 is formed on the gate insulating layer 12, including over the other side of the ohmic layer 15. A source electrode 17 is formed on the ohmic layer 15 and the ITO pattern 16.

Since the ITO pattern 16 is formed between the data bus line 30 and the semiconductor layer 13, it can be used for redundancy when an electrical short occurs in the data bus line 30. Between the source electrode 17 and the gate insulating layer 12, the pixel electrode 40 composed of ITO is formed. A passivation layer 50 is formed thereon as shown in FIGS. 2A and 2B.

The above-described TFT-LCD can be fabricated by the following method. On a glass substrate 100, a metal layer is formed by sputtering, and then patterned to form a gate electrode 11 and a gate bus line 20. A gate insulating layer 12, an amorphous silicon layer 13, and an insulating layer 14 are then sequentially deposited by CVD (chemical vapor deposition) on the substrate 10 and gate electrode 11.

Next, the insulating layer 14 is selectively etched back to form a channel protecting layer 14 on the amorphous silicon layer 13 corresponding to the gate electrode 11. This channel protecting layer 14 serves as an etching stopper when the ohmic layer 15 on the amorphous silicon semiconductor layer 13 is etched, to prevent damage to the amorphous silicon layer.

The n$^+$ type amorphous silicon layer 15 is formed on the amorphous silicon layer 13, including over the channel protecting layer 14. The amorphous silicon layers 15 and 13 are then sequentially removed to form the semiconductor layer and the ohmic layer at the same time. The gate insulating layer 12 within a pad portion is also removed by etching to expose the pad electrode.

Subsequently, an ITO film is formed over the substrate and patterned to form a pixel electrode 40, and at the same time to form an ITO pattern 16 for redundancy. The ITO pattern 16 is formed at a portion where the data bus line is formed. After the deposition of a metal over the substrate, a photo-etching process is performed, thereby allowing source and drain electrodes 17 and 18 to be formed on the ohmic layer and the ITO pattern, and on the ohmic layer and the pixel electrode, respectively. The data bus line 30 is formed on the ITO pattern 16. Finally, to prevent static electricity and form an oxide layer, the source and drain electrodes 17 and 18 connected to each other are electrically isolated by etching, and then a protecting layer 50 is formed thereon.

When a signal voltage is applied to the source and drain electrodes of a TFT-LCD fabricated in the manner described above, electrons are produced in the semiconductor layer 13. A current signal is thereby provided to the drain electrode, causing the pixel corresponding to each TFT to be driven.

Since in the prior art TFT-LCD the ITO film for redundancy is formed under a data bus line, an electrical open circuit in the data bus line can be repaired by using the ITO film. However, while photo-etching during fabrication of the above-described TFT-LCD, a non-exposed portion of a photoresist layer is produced by the presence of dust and particles of photoresist. Then, due to the non-exposed portion, an electrical short circuit between source and drain electrodes can occur and cause a point defect. Since point defects of this type can not be repaired in the prior art TFT-LCD, production yields are lowered.

SUMMARY OF THE INVENTION

It is an object of the present invention to provide a method for fabricating a liquid crystal display device in which point defects such as electrical short circuits between drain and pixel electrodes, and electrical short circuits between source and drain electrodes, can be repaired by performing a photo-masking process one time.

It is a further object of the present invention to provide a method for fabricating a liquid crystal display device in which a bad pattern between a source/drain electrode and a pixel electrode due to dust or particles of photoresist produced before and after coating the photoresist layer can be repaired to provide a device which is free from faults.

It is another object of the present invention to provide a method for fabricating a liquid crystal display device which enhances the production yield of large-scale, high-density LCD devices.

It is an additional object of the present invention to provide a method for fabricating a liquid crystal display device in which short circuit defects can be simultaneously repaired by performing a one-time repair process, even if the short circuit defects occur at several portions of the device.

A liquid crystal display device in accordance with one aspect of the invention comprises a substrate and a plurality of thin film transistors formed on the substrate. Each of the thin film transistors is composed of a gate electrode formed on the substrate in a matrix, a gate insulating layer, a semiconductor layer, a channel protecting layer, an ohmic layer and a source/drain electrode. A plurality of pixel electrodes are arranged alternatively with respect to the thin film transistors. A plurality of gate bus lines commonly connected to the gate electrodes of the thin film transistors arranged in the same row of the plurality of thin film transistors. A plurality of data bus lines are formed in zigzag form between the pixel electrodes and commonly connected to source electrodes of the thin film transistors arranged in the same column.

A method for fabricating a TFT-LCD in accordance with the present invention includes forming the gate bus lines and the gate electrodes on a glass substrate, and sequentially depositing a gate insulating layer, an amorphous silicon layer and an insulating layer on the substrate including the gate electrode. The insulating layer is then etched back to form a channel protecting layer on the amorphous silicon layer at a position corresponding to the gate electrode. A conductive amorphous silicon layer is formed on the amorphous silicon layer including the channel protecting layer. The amorphous silicon layers are sequentially etched to form the ohmic and semiconductor layers corresponding to the gate electrode. The ohmic layer is selectively removed only on a center portion of the channel protecting layer by using the channel protecting layer as an etch stopper. An ITO film is formed thereon and patterned to form the pixel electrodes, and an ITO pattern for redundancy is formed on both side surfaces of the ohmic layer and on the gate insulating layer. A source/drain electrode is formed thereon to form the data bus lines on the ITO pattern and a photoresist layer is deposited thereon. The photoresist layer is etched to remove a photoresist portion formed between the data bus line and the pixel electrodes arranged in columns adjacent with each other, a photoresist portion formed between the source and drain electrodes of the thin film transistor, a photoresist portion formed between the pixel electrode and the data bus line arranged in the same row, a photoresist portion formed between the pixel electrode and the gate bus line arranged the same row, and a photoresist portion formed between the thin film transistor arranged in rows adjacent with each other and the pixel electrode. A short-circuited portion of the removed photoresist portions is repaired. The photoresist layer is then removed and a protecting layer formed thereon.

In this method, the step of repairing the short-circuited portion comprises etching a portion between the data bus line and the pixel electrode using the photoresist layer as a mask, when the short occurs between them. The step of repairing the short-circuited portion comprises etching a portion of the ohmic layer between the source and drain electrodes using the photoresist layer as a mask, when the short occurs between them. The step of repairing the short-circuited portion comprises etching a portion between the thin film transistor and the pixel electrode using the photoresist layer as a mask, when the short occurs between them.

By performing only a photo-masking process at one time, in accordance with the present invention, it is possible to easily repair a point defect caused by a short between drain and pixel electrodes or between source and drain electrodes, during fabrication, thereby obtaining a TFT-LCD free from defects. Also, by using a redundancy structure in the data bus line, it is possible to easily repair a short defect occurring between a transparent conductive film (i.e. a pixel electrode and the like) and a source/drain electrode due to particles or dust of photoresist. Since short defects can be easily repaired using the fabrication method of the present invention, production yields of TFT-LCDs having a large-scale and high integration can be improved.

BRIEF DESCRIPTION OF THE DRAWINGS

This invention may be better understood and its objects will become apparent to those skilled in the art by reference to the accompanying drawings, where.

DETAILED DESCRIPTION OF THE PREFERRED EMBODIMENTS

Figure 1:
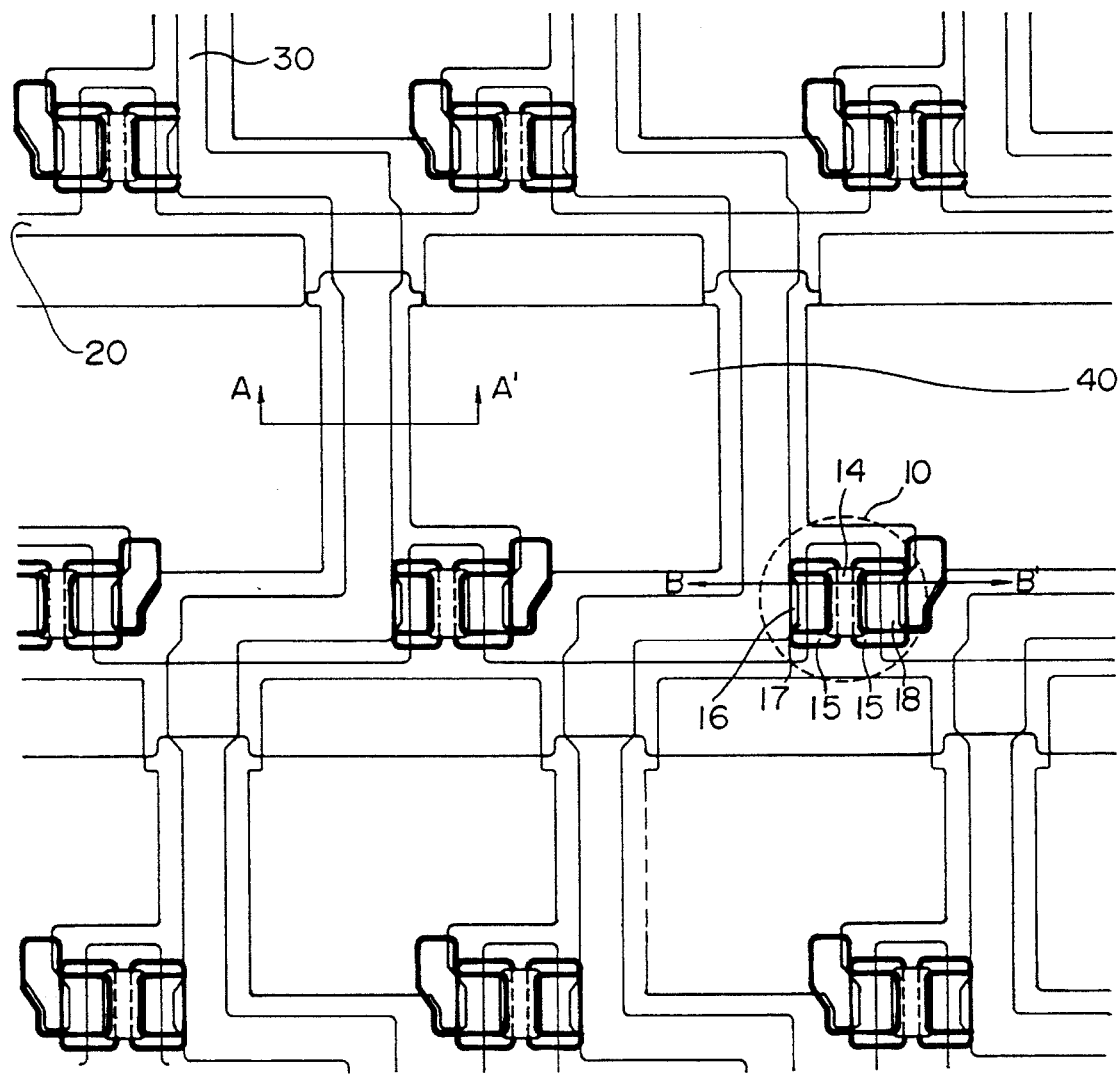
FIG. 1 is a plan view of a prior art TFT-LCD with a repair structure.
Figure 2A:
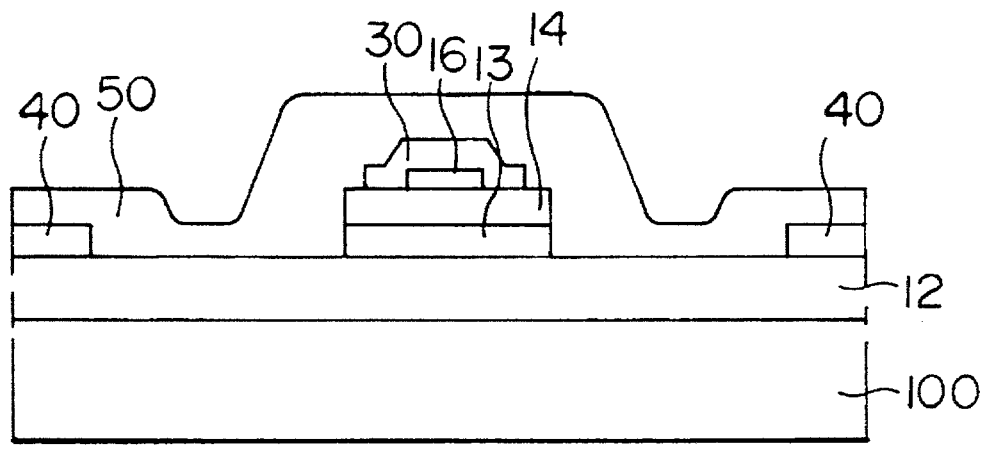
FIG. 2A is a cross-sectional view taken along the line A–A' of FIG. 1.
Figure 2B:
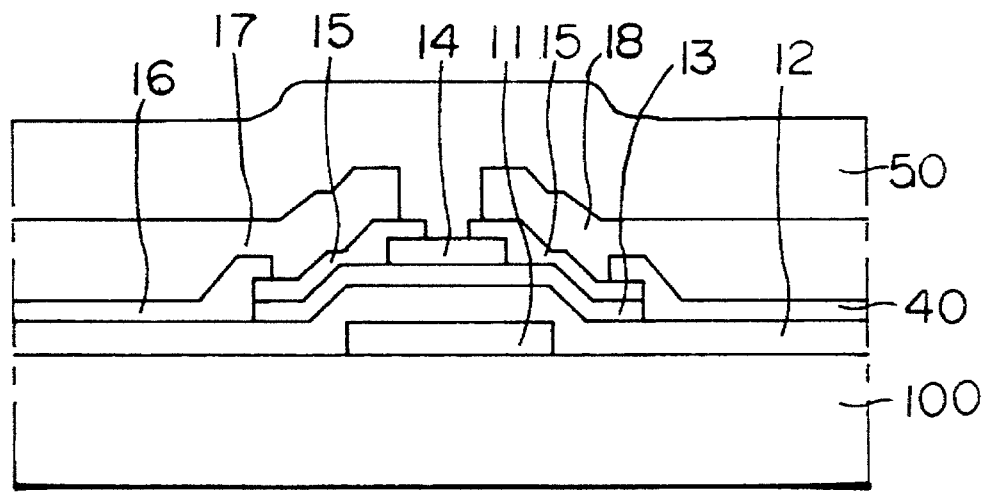
FIG. 2B is a cross-sectional view taken along the line B–B' of FIG. 1.
Figure 3:
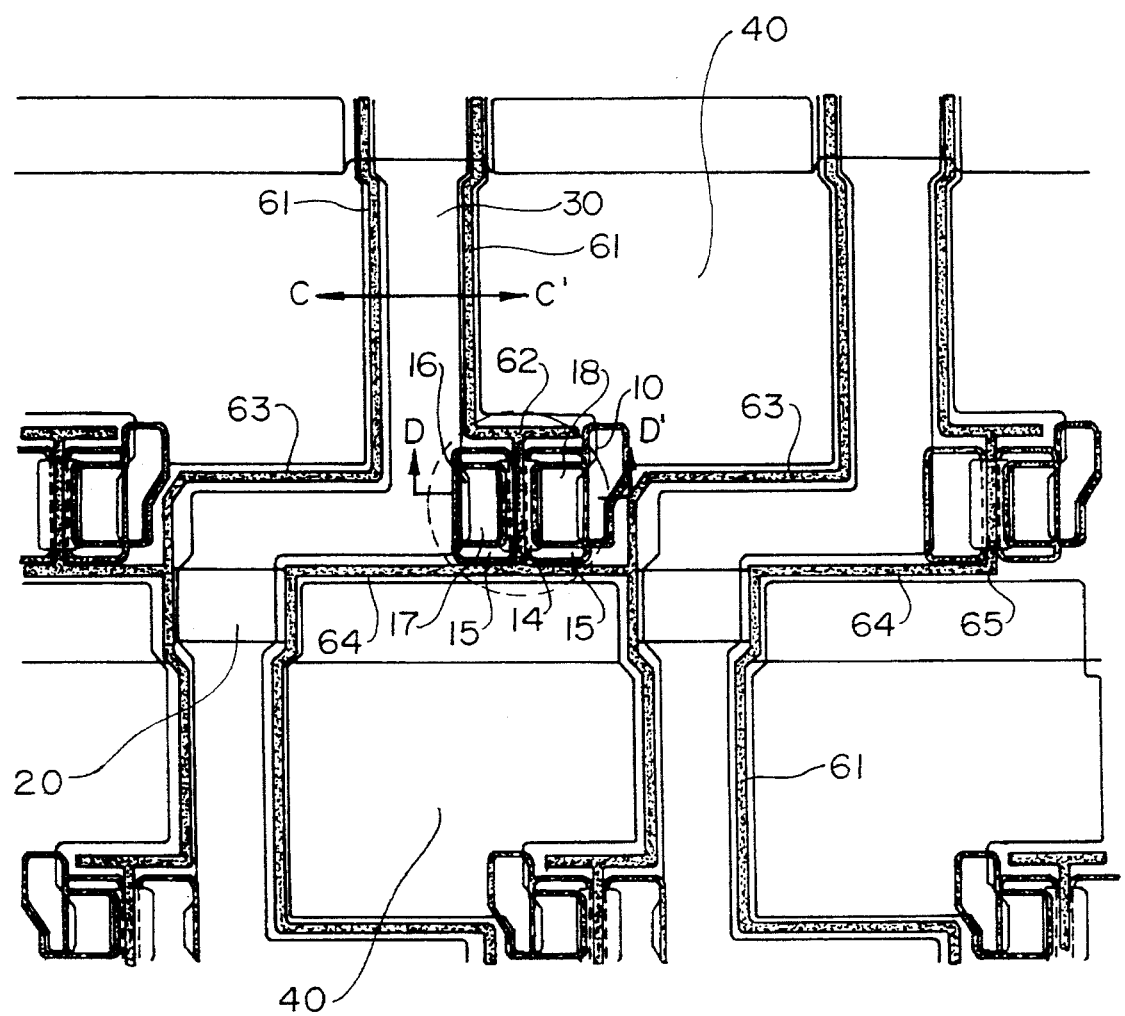
FIG. 3 is a plan view showing the construction of a liquid crystal display device which is fabricated by the fabrication method of the present invention.

FIG. 3 shows the construction of the LCD of the present invention. Component elements having similar functions to the component elements of the TFT-LCD shown in FIG. 1 are indicated by the same reference numerals, and descriptions thereof are omitted.

Referring to FIG. 3, the LCD of the present invention comprises a plurality of pixel electrodes 40 and TFTs 10 arranged in a matrix of rows and columns, and a plurality of gate and data bus lines 20 and 30, respectively. In this LCD, the pixel electrodes 40 and the TFTs 10 are alternately arranged with respect to each other. The gate bus line 20 is commonly connected to gates of the TFTs 10 arranged in the same row. The data bus line 30 is formed in a zigzag pattern between the pixel electrodes 40 and is commonly connected to source electrodes 17 of the TFTs 10 arranged in the same column.

Figure 4A:
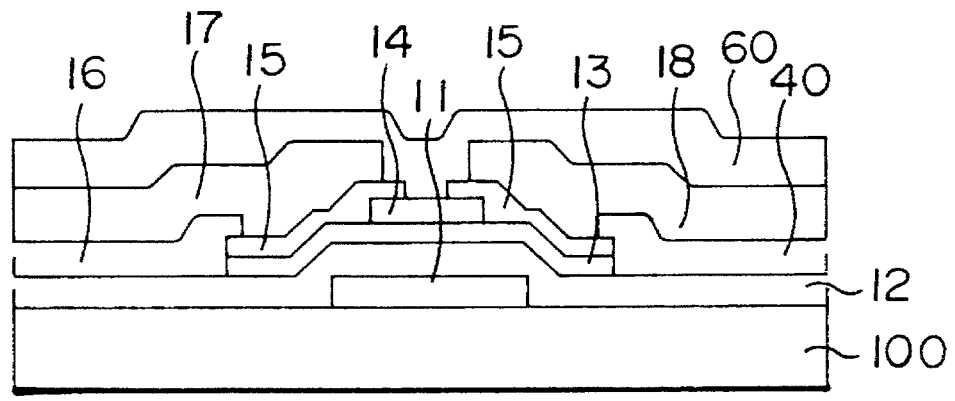
FIG. 4A is a cross-sectional view taken along the line c–c' of FIG. 3.
Figure 4B:
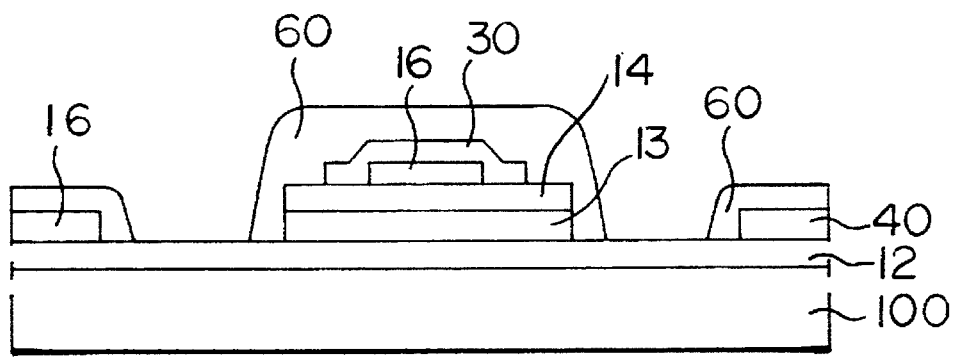
FIG. 4B is a cross-sectional view taken along the line D–D' of FIG. 3.

With reference to FIGS. 4A and 4B, each of the TFTs 10 has a gate electrode 11 formed on a glass substrate 100, and a gate insulating layer 12 formed over the substrate, including over the gate insulating layer 12. An amorphous silicon semiconductor layer 13 is formed above the gate electrode 11 with the gate insulating layer 12 interposed therebetween. A channel protecting layer 14 is formed on the semiconductor layer 13, and an $n^+$ type amorphous silicon ohmic layer 15 is formed over the semiconductor layer 13, including over the channel protecting layer 14 except a center surface of the channel protecting layer. A redundancy ITO pattern 16 is formed on the gate insulating layer 12, including over one side of the ohmic layer 15. A drain electrode 18 is formed on the gate insulating layer 12, including over the other side of the ohmic layer 15, and a source electrode 17 is formed on the ohmic layer 15 and the ITO pattern 16. Since the ITO pattern 16 is formed between the data bus line 30 and the semiconductor layer 13, it can be used for redundancy when an electrical short occurs in the data bus line 30.

Between the source electrode 17 and the gate insulating layer 12, the pixel electrode 40 composed of ITO is formed. In the construction of the TFT-LCD described above, electrical shorts can be repaired during fabrication of the TFT-LCD. As shown in FIGS. 4A and 4B, before formation of a protecting layer 50 (shown in FIG. 5G) over a substrate 100, a photoresist layer 60 is deposited thereon and patterned to form a repairing structure on the substrate 100 by photo-etching. In FIG. 3, the portion indicated by the thick solid line represents the portion where the photoresist is removed by the patterning process (hereinafter, referred to as "removed portions").

As shown in FIG. 3, removed portions 61 (where the photoresist is removed between the data bus line 30 and the pixel electrodes 40) are arranged in columns adjacent to each other, and function as first repair portions for repairing electrical shorts between them. Removed portions 62 (where the photoresist is removed between the source and drain electrodes of the TFT 10) function as second repair portions for repairing electrical shorts in the channel regions between them. Also, removed portions 63 (where the photoresist is removed between the pixel electrode 40 and the data bus line 30 arranged in the same row) function as third repair portions 63 for repairing shorts between them. Removed portions 64 (where the photoresist is removed between the pixel electrode and the gate bus line arranged the same row) function as fourth repair portions for repairing shorts between them. Removed portions 65 (where the photoresist is removed between the TFTs 10 arranged in rows adjacent to each other and the adjacent pixel electrodes) function as fifth repair portions for repairing shorts between them.

Since the TFT-LCD has a repair structure which is constituted by the first to fifth repair portions 61–65, respectively, it is possible to eliminate point defects such as electrical shorts occurring during fabrication. For example, when an electrical short occurs in the channel region between the bus line and the pixel electrode, or between the pixel electrode and the source/drain electrode of the TFT, an exposed short portion of the repair portions is etched using a photoresist layer as a mask, thereby completing the repair process. In addition, a protecting layer 70 is formed over the substrate to provide the TFT-LCD free from point defects on a main surface thereof.

Figure 5A:
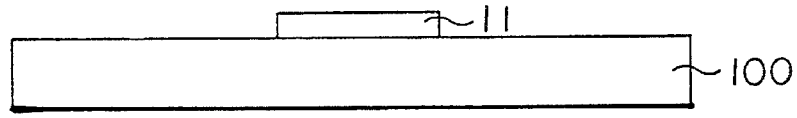
FIGS. 5A to 5G are cross-sectional views showing the processes of the method for fabricating a liquid crystal display device in accordance with one embodiment of the present invention.
Figure 5B:
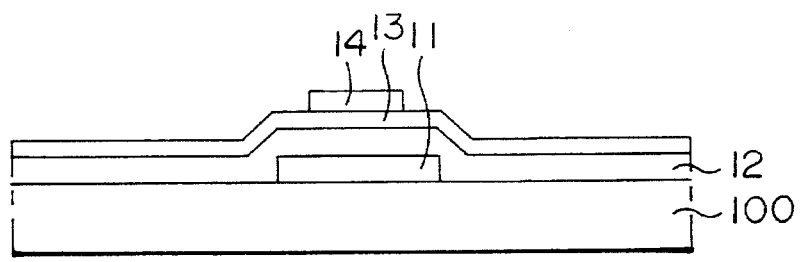

A method for fabricating the TFT-LCD will be described in detail with reference to FIGS. 5A to 5G. Referring to FIG. 5A, on a glass substrate 100, metal is deposited by sputtering, and patterned to form a gate electrode 11 and a gate bus line 20. Next, as shown in FIG. 5B, on the substrate 100, including over the gate electrode 11, a gate insulating layer 12, an amorphous silicon layer 13, and an insulating layer 14 are sequentially formed by a well-known CVD method. The insulating layer 14 is selectively removed by etching, whereby a patterned insulating layer 14 is formed. Because the patterned insulating layer 14 is used as a channel protecting layer which serves as an etch stopper during the etching process of the ohmic layer, it is possible to prevent the amorphous silicon semiconductor layer from being damaged.

Figure 5C:
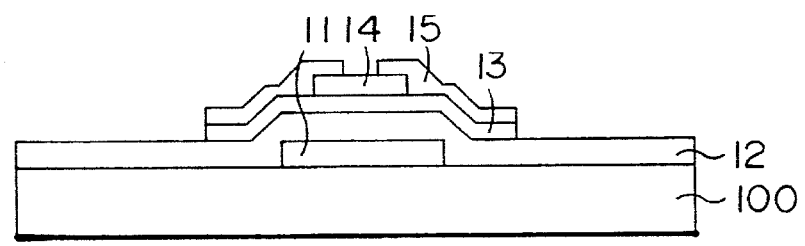

With reference to FIG. 5C, on the patterned insulating layer 14 and the amorphous silicon layer 13, an $n^+$ type amorphous silicon layer 15 is deposited. The amorphous silicon layers 13 and 15 are then sequentially removed by etching to form semiconductor and ohmic layers, respectively. A portion of the ohmic layer above the gate electrode 11 is removed to expose a surface of the semiconductor layer 13.

Figure 5D:
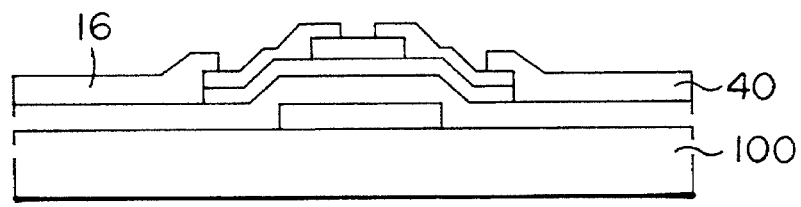
Figure 5E:
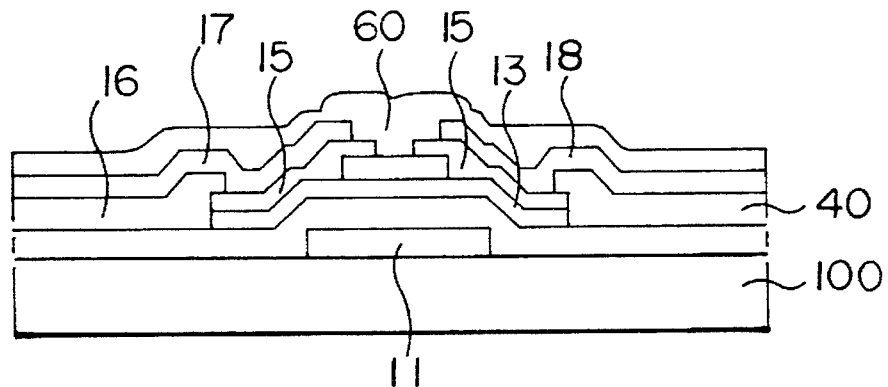

As shown in FIG. 5D, an ITO film is deposited over the substrate, and then patterned to form an ITO pattern 16 and a pixel electrode 40. The ITO pattern 16 is used as a data bus line and as a redundancy for repairing a short in the data bus line. As shown in FIG. 5E, a metal thin film is formed thereon and patterned to form source and drain electrodes 17 and 18. At the same time, a data bus line 30 is formed on the ITO pattern 16. Next, a photoresist layer 60 is deposited thereon and then selectively removed in a portion subject to the occurrence of defects such as an electrical short, as shown in FIG. 5E. The portion removed in this manner is a repair portion to be used when a short defect occurs. If a short defect occurs, after removal of the short-circuited portion, the repair portion is substituted for the short-circuited portion.

As described above, after patterning the photoresist layer, the structure of FIG. 5C is dipped in a metal etching solution to remove a defective portion (i.e. a portion where a short circuit is produced), and thereby eliminate the defect caused by the short.

Figure 5F:
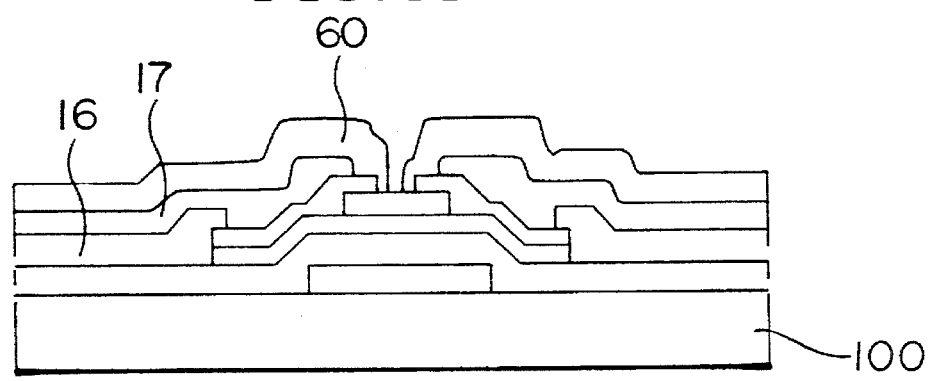
Figure 6A:
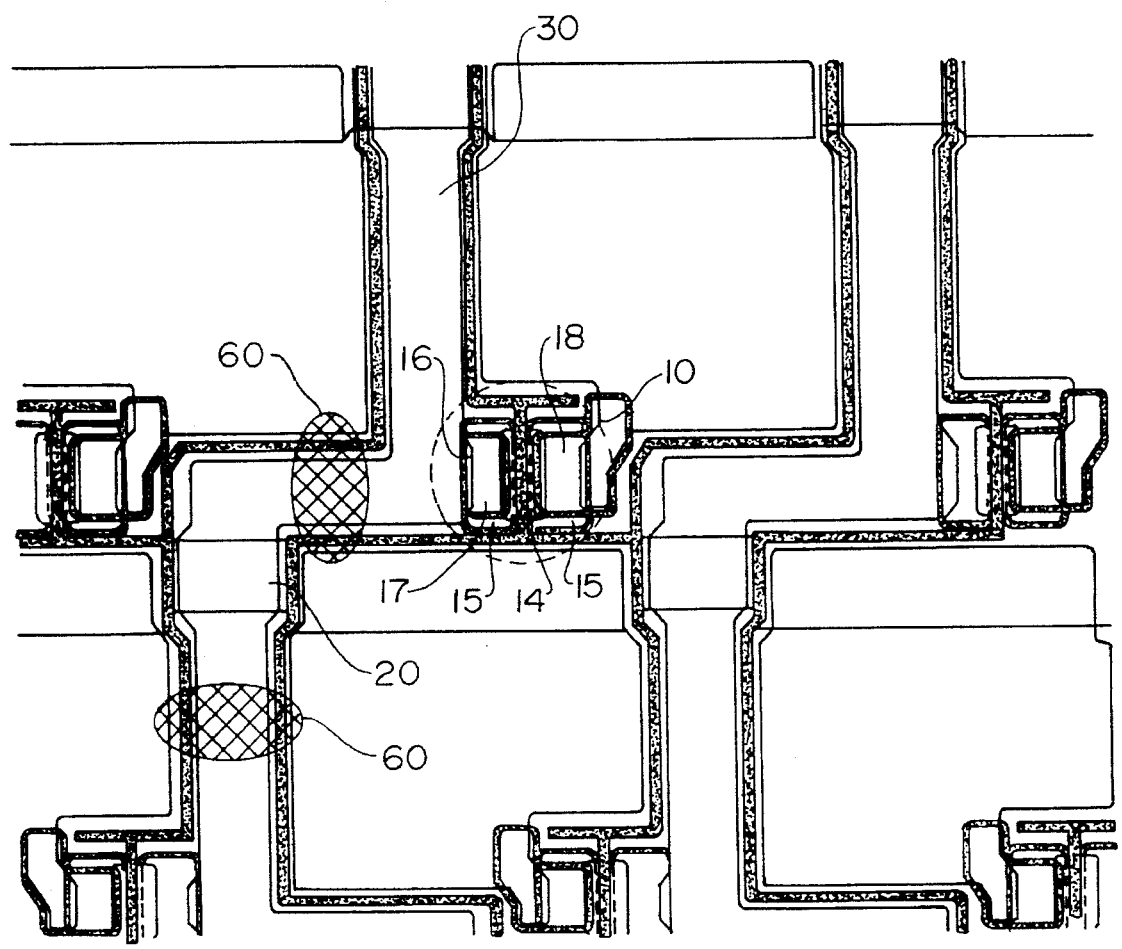
FIGS. 6A and 6B are plan views illustrating how an electrical short is repaired in the liquid crystal display device fabricated by the method of the present invention.
Figure 6B:
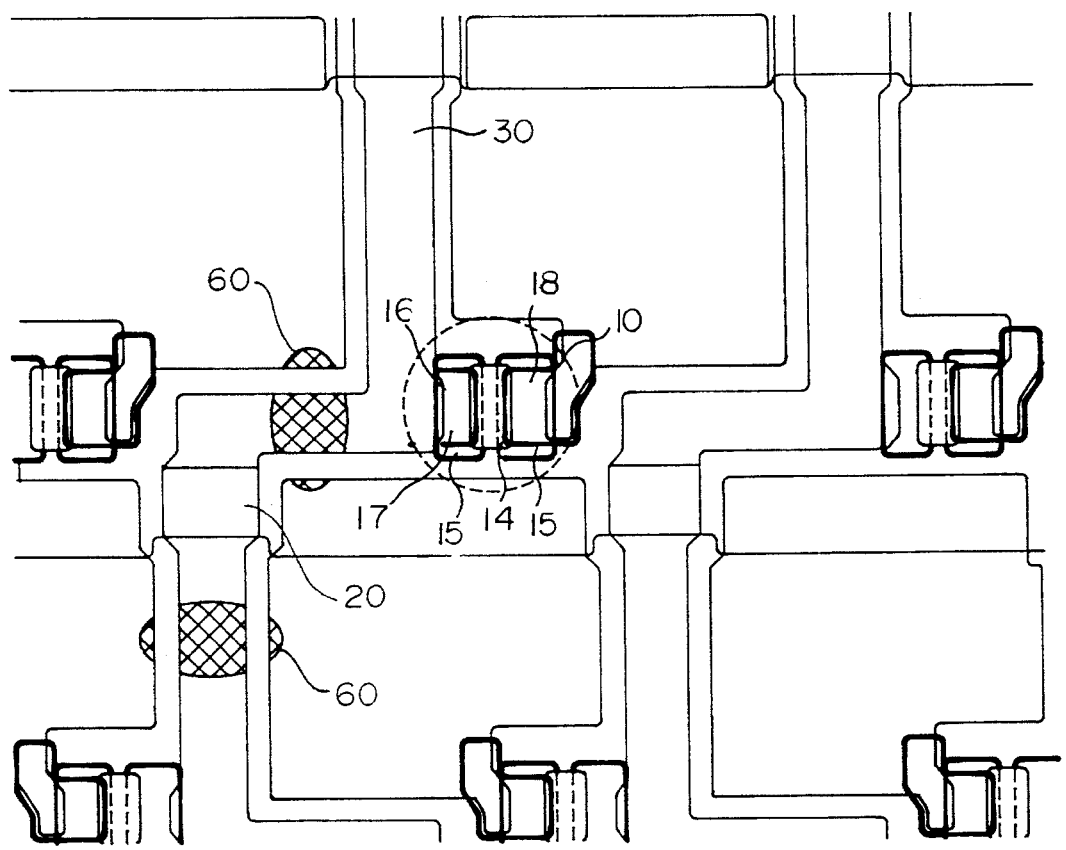

As shown in FIG. 6A, when a short is present between the data bus line and the pixel electrode or between the pixel electrodes, a photoresist mask pattern 60 is formed thereon as shown in FIG. 5F, and therefore a portion susceptible to the occurrence of a short is removed in the photoresist mask pattern 60 and exposed as shown in FIG. 6A. Accordingly, upon the occurrence of a short, if the defective portion, (i.e. a short-circuited portion), is removed using the photoresist pattern as a mask, the short-circuited portion is open again as shown in FIG. 6B. As a result, the defective portion can be repaired. Even if several defective portions occur, they can be repaired by performing the repairing process at the same time. Since the defective portion can be repaired by performing a photo-masking process once as described above, masking processes for performing additional repairs are not required.

Figure 5G:
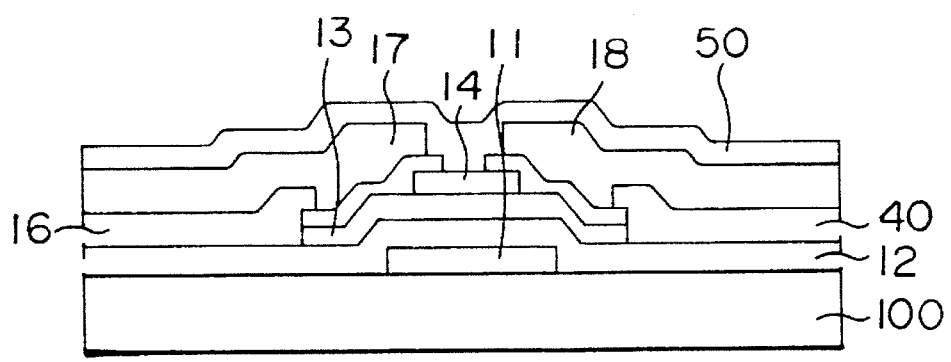

After repairing the short circuit defects, the photoresist remaining on the substrate is entirely removed. Finally, as shown in FIG. 5G, a protecting layer 19 is formed thereon to provide a TFT-LCD free from defects.

According to the fabrication method of the present invention, by performing a masking process once, it is possible to easily repair point defects caused by short circuits between drain and pixel electrodes or between source and drain electrodes during fabrication. TFT-LCDs free from a defects can thereby be obtained.

In addition, by using the redundancy structure of a data bus line, it is possible to easily repair a short defect present between a transparent conductive film (i.e. a pixel electrode and the like) and a source/drain electrode due to particles or dust of photoresist. Since short defects can be easily repaired using the fabrication method of the present invention, the production yield of TFT-LCDs having a large-scale and high integration is improved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a liquid crystal display device which comprises a substrate; a plurality of thin film transistors formed on the substrate, each of the thin film transistors being including a gate electrode formed on the substrate in a matrix, a gate insulating layer, a semiconductor layer, a channel protecting layer, an ohmic layer and a source/drain electrode; a plurality of pixel electrodes arranged alternately with respect to the thin film transistors; a plurality of gate bus lines commonly connected to the gate electrodes of the thin film transistors arranged in the same row; and a plurality of data bus lines formed in zigzag form between the pixel electrodes and commonly connected to source electrodes of the thin film transistors arranged in the same column; the method including the steps of:

forming the gate bus lines and the gate electrodes on the substrate;

sequentially depositing the gate insulating layer, an amorphous silicon layer and an insulating layer on the substrate, including on the gate electrode;

etching back the insulating layer to form the channel protecting layer on the amorphous silicon layer at a position corresponding to the gate electrode;

forming a conductive amorphous silicon layer on the amorphous silicon layer, including on the channel protecting layer;

sequentially etching the amorphous silicon layers to form the ohmic and semiconductor layers corresponding to the gate electrode;

selectively removing the ohmic layer only on a center portion of the channel protecting layer, using the channel protecting layer as an etch stopper;

forming an ITO film on previously formed layers and patterning the film to form the pixel electrodes and an ITO pattern for redundancy on both side surfaces of the ohmic layer and on the gate insulating layer;

forming a source/drain electrode thereon to form the data bus lines on the ITO pattern;

depositing a photoresist layer on the previously formed layers;

etching the photoresist layer to remove a photoresist portion formed between the data bus line and the pixel electrodes arranged in columns adjacent to each other, a photoresist portion formed between the source and drain electrodes of the thin film transistor, a photoresist portion formed between the pixel electrode and the data bus line arranged in the same row, a photoresist portion formed between the pixel electrode and the gate bus line arranged the same row, and a photoresist portion formed between the thin film transistor arranged in rows adjacent to each other and the pixel electrode;

repairing short-circuited portions of the removed photoresist portions;

removing the photoresist layer; and forming a protecting layer on the previously formed layers.

2. The method of claim 1, wherein the step of repairing the short-circuited portion comprises etching a portion between the data bus line and the pixel electrode using the photoresist layer as a mask, when a short circuit is present between them.

3. The method of claim 1, wherein the step of repairing the short-circuited portion comprises etching a portion of the ohmic layer between the source and drain electrodes using the photoresist layer as a mask, when a short circuit is present between them.

4. The method of claim 1, wherein the step of repairing the short-circuited portion comprises etching a portion between the thin film transistor and the pixel electrode using the photoresist layer as a mask, when a short circuit is present between them.

* * * * *